(12) United States Patent
Lee

(10) Patent No.: US 6,194,365 B1
(45) Date of Patent: Feb. 27, 2001

(54) COMPOSITION FOR CLEANING AND ETCHING ELECTRONIC DISPLAY AND SUBSTRATE

(76) Inventor: Ki Won Lee, 108-10, Il-dong, Ansan-si, Kyunggi-do 425-150 (KR)

(*) Notice: Subject to any disclaimer, the term of this patent is extended or adjusted under 35 U.S.C. 154(b) by 0 days.

(21) Appl. No.: 09/142,750
(22) PCT Filed: Jan. 21, 1998
(86) PCT No.: PCT/KR98/00011
§ 371 Date: Sep. 15, 1998
§ 102(e) Date: Sep. 15, 1998
(87) PCT Pub. No.: WO98/31768
PCT Pub. Date: Jul. 23, 1998

(30) Foreign Application Priority Data

Jan. 21, 1997 (KR) .................................................. 97-1539
Oct. 17, 1997 (KR) .................................................. 97-53384

(51) Int. Cl.$^7$ ........................... C23G 1/00; C09K 13/04
(52) U.S. Cl. .................. 510/175; 134/2; 134/3; 438/689; 438/753; 252/79.2; 252/79.3
(58) Field of Search ........................ 252/79.3, 79.4, 252/79.2, 364; 438/689, 753; 134/3, 41, 38, 2, 40, 42; 510/108, 176, 202, 414, 499, 189, 255, 175, 257, 254, 181, 238, 240, 269

(56) References Cited

U.S. PATENT DOCUMENTS

| | | | |
|---|---|---|---|
| 3,565,707 | * | 2/1971 | Radimer et al. .......................... 156/3 |
| 3,654,001 | * | 4/1972 | Mann ..................................... 156/18 |
| 3,725,224 | * | 4/1973 | Kendall .............................. 204/141.5 |
| 3,986,970 | * | 10/1976 | Shiga ................................... 252/79.3 |
| 4,517,106 | * | 5/1985 | Hopkins et al. ...................... 252/79.4 |
| 4,555,304 | * | 11/1985 | Salzle ................................... 156/663 |
| 4,614,607 | * | 9/1986 | Loch ..................................... 252/142 |
| 5,164,018 | * | 11/1992 | Barcelona et al. ...................... 134/28 |
| 5,211,807 | * | 5/1993 | Yee ....................................... 156/664 |
| 5,296,268 | * | 3/1994 | Iantosca ................................ 427/328 |
| 5,393,447 | * | 2/1995 | Carlson et al. ........................ 252/101 |
| 5,688,755 | * | 11/1997 | Ikeda et al. ........................... 510/254 |
| 5,810,938 | * | 9/1998 | Murphy ..................................... 134/2 |

FOREIGN PATENT DOCUMENTS

| | | |
|---|---|---|
| 183 883 | 11/1955 | (AT) . |
| 1 209 844 | 1/1966 | (DE) . |
| 0 106 301 A1 | 4/1984 | (EP) . |
| 1 276 550 | 6/1972 | (GB) . |
| 52074604 * | 2/1981 | (JP) . |
| 56011997 * | 2/1981 | (JP) . |

* cited by examiner

Primary Examiner—Yogendra Gupta
Assistant Examiner—Gregory E. Webb
(74) Attorney, Agent, or Firm—Renner, Otto, Boisselle & Sklar, LLP

(57) ABSTRACT

This invention relates to a composition for cleaning and etching the surface in fabricating electronic displays and the substrates. Specifically this invention relates to a composition to effectively remove the contaminants by cleaning, to remove any contaminants on the surface, and to etch $SiO_2$ and Si substrate in the fabrication process of electronic displays, quartz devices, wafer, and semiconductor wafer. According to this invention, it is possible to clean and etch more efficiently and conveniently. Also The surface roughness is improved. Further the composition of this invention can be made available in powder type for preparing a defined amount of solution. It provides the conveniences in transportation, handling and storage.

18 Claims, 2 Drawing Sheets

COMPOSITION FOR CLEANING AND ETCHING ELECTRONIC DISPLAY AND SUBSTRATE

BACKGROUND OF THE INVENTION

1. Field of the Invention

This invention relates to a composition for cleaning and etching the surface in fabricating electronic displays and the substrates.

Particularly this invention relates to a composition to effectively remove the contaminants by cleaning, to remove any contaminants on the surface, and to etch $SiO_2$ and Si substrate in the fabrication process of electronic displays, quartz devices, wafer, and semiconductor wafer.

In case of Cathod Ray Tube(CRT) which is a very popular kind of electronic display, the fresh bulb should be cleaned by 10~18% Hydrofluoric Acid (HF) solution before coating process.

The cleaned panel is further processed to the next positions such as panel inner black coating, screen coating, lacquer spraying. aluminizing, funnel inner dag coating, panel/funnel frit sealing, neck washing, mounting and exhausting, funnel outer dag coating, panel face coating, etc.

For panel face coating, the coating materials may include $In_2O_3$, $Sb_2O_3$, $SnO_2$, $SiO_2$ and before face-coating the surface contaminants are removed by cleaning with HF solution 1~2% or ammonium bifluoride solution. The defective coating could be removed by using 10~30% ammonium bifluoride solution "before backing" and by using $CeO_2$ "after backing".

In case of LCD, the manufacturing process of LCD may include cleaning, etching during lithography process, and it is important to etch uniformly and reproducially.

The types of materials to be cleaned and to be etched and the compositions for cleaning and etching solution for LCD and semiconductor wafer are shown in below table.

| | |
|---|---|
| Cleaning($SiO_2$) | 1. $H_2SO_4$:$H_2O_2$(6:1), 120° C. |
| | 2. 50% HF:$H_2O$(1:100~1000) |
| | 3. $NH_4OH$:$H_2O_2$:$H_2O$(1:1:7) SC-1 |
| | 4. HCl:$H_2O_2$:$H_2O$(1:1:6) SC-2 |
| | 5. D.I. water rinse |
| Etching($SiO_2$) | 1. 40% $NH_4F$:50% HF(7:1) BOE |
| | 2. 40% $NH_4F$:50% HF(7:1) + $H_2O_2$ |
| Etching(SiNx) | $H_3PO_4$:$H_2O$(85:1) or |
| | 40% $NH_4F$:50% HF(20:1) |
| Etching(Al and Al alloy) | $H_3PO_4$:$CH_3COOH$:$HNO_3$:$H_2O$ (65:5:5:25) |

The required conditions of above cleaning and etching solutions may include control of cleaning and etching rate, etching selectivity, control of etching profile, stability and homogeneity of the solutions.

In case of quartz devices which are used for manufacturing of wafer, the manufacturing process of quartz devices is as follows; raw material—cleaning (11~16.5% HF solution, 2~3 minutes)—waxing—Cutting and polishing—dewaxing—ultrasonic washing—cleaning (15% HF solution, 5 minutes)—benching—cleaning (11~16.5% HF solution, 5 minutes)—drying High concentration of HF solution are used for removing the surface contaminants and thermally oxidized layer formed, but HF solution may cause problems relating to smoothness, etching damage, crack, etc. The quartz devices are contaminated during wafer fabricating process, specially in the process of heat treatment and deposition. HF solution is used for cleaning such contaminants of quartz devices.

In case of semiconductor wafer, the fabrication process may include:

I. Forming process of wafer
1. Growing of single crystal silicon
2. Slicing
3. Lapping (approx. 60 μm by mechanical polishing
4. Chemical polishing (approx. 30 μm by etching)
5. Polishing (approx. 10 μm by 3 times polishing to acquire the desired roughness)
6. Cleaning II. Fabrication process of semiconductor wafer
7. Initial cleaning
8. Oxidization
9. Ion dopping and diffusing
10. Epithexial growth
11. Forming of insulating and conductive layer
12. Forming of polarity In the process of above 8~12, lithography steps are accompanied. As substrates pass through each process, chemical etching on silicon and silicon oxide is performed, and ionic and non-ionic contaminants and other contaminants formed on silicon and silicon oxide should be removed.

More details about the process to require cleaning and etching are described as below.

The oxidizing process (above No. 8) includes the pre-washing step before growing $SiO_2$ layer on the substrate, however, the pre-washing solution such as solvent, sulfuric acid, and/or hydrogen peroxide may produce a thin-oxidized silica layer on the surface while washing. Such thin-oxidized silica layer should be removed by HF solution (HF:$H_2O$= 10:1).

The diffusing process (above No. 9) includes washing step before diffusing. The washing solution such as mixed solution with sulfuric acid and hydrogen peroxide or mixed solution of ammonium hydroxide and hydrogen peroxide can usually remove organic contaminants and ionic contaminant by dipping for 10~20 minutes. However, such washing causes by forming of oxidized layer on the air-exposed part of silicon surface thus the oxidized layer should be removed by using diluted HEF solution.

In lithography process, etchant is used to define the ion injection/diffusing part and the shield part on the surface of substrate.

There are usually two kinds of etching, wherein one is wet etching (chemical etching) and the other is dry etching (plasma etching), however, lithography is deemed to be a kind of etching.

Wet etch is chemical etch to be performed by chemical reaction between chemical solution and the layer to be removed. The type of chemical and the composition ratio differ according to the kinds and characteristics of the layers.

The principles of wet etch is as follow.

There are two ways of creating $SiO_2$ film, wherein one is thermal-grown $SiO_2$ on silicon substrate, and the other is Deposit (CVD) $SiO_2$ on various films. Any kind of etching method known in this art utilized the dissolving nature of HF.

Thermal-grown $SiO_2$ film is etched by following reaction.

$$HF \rightarrow H^+ + F^-$$

The isolated F ion reacts on $SiO_2$ and etching is performed as follows.

$$SiO_2 + 4HF \rightarrow SiF_4 + 2H_2O$$

$$2HF + SiF_4 \rightarrow H_2SiF_6$$

From the above formula, F ion is reduced according as etching is proceeding and hydrogen concentration is decreased as the solution becomes diluted by produced $H_2O$. As a result, the etching rate changes and the process becomes unstable, which is disadvantageous to uniformity and reproductivity.

To standardize the etching rate, ammonium fluoride ($NH_4F$) can be added into solution. Ammonium fluoride dissociated ammonium ion from fluoride ion and the isolated fluoride ion participates in etching.

$$NH_4F \rightarrow NH_4 + F^-$$

The reduction of F ion consumed for etching is compensated by adding ammonium fluoride and consequently the concentration of hydrogen can be maintained to keep the etching rate constant.

As almost wet enchants are isotropic (etching in all directions), the undercut is made. Excessive undercut usually occurs in the wet etch to cause resist lifting. This is the drawback of wet etch and consequently it is difficult to use wet etch in manufacturing high integrated circuit. Single crystal silicon and metal layer are etched after oxidizing, wherein nitric acid is used as oxidant. Single crystal silicon is oxidized to be $SiO_2$ which should be etched by hydrofluoric acid.

The mixed acid to be made of $HNO_3:HF:CH_2COOH$ or $H_3PO_4 = 2.5:1:1$ is used for etching single crystal silicon, wherein $CH_2COOH$ or $H_3PO_4$ serves to control the rapid and excessive reaction to be done by $HNO_3$ and HF. However, as such control is still not sufficient, single crystal silicon wafer can be treated usually when the solution is saturated with $H_2SiF_6$ to be produced from etching reaction. The exothermic reaction occurs in such mixed acid during treatment and the solution temperature increases by 20° C. in reaction time of 1~2 minute(s).

The wafer is etched magnitude of approx. 30 μm. Such vigorous reaction causing the etching damage and control of activity in conventional etchant is usually difficult.

The etching reaction with such mixed acid is as follows.

$$Si + 4HNO_3 = SiO_2 + 4NO_2(g) + 2H_2O \quad (1)$$

$$SiO_2 + 6HF = H_2SiF_6 + 2H_2O \quad (2)$$

$$3Si + 4HNO_3 + 18HF = 3H_2SiF_6 + 4NO + 8H_2O \quad (3)$$

For the treatment of silicon oxide, buffered hydrofluoric acid (BHF) is used, the reaction formula is as follows.

$$4nHF + SiO_2 = SiF_4\uparrow + 2H_2O + nH^+ + nF^{-1} \quad (4)$$

$$2HF + SiF_4 = H_2SiF_6 \quad (5)$$

Also, for example, the heated $HPM(HCl/H_2O_2$, SPM ($H_2SO_4 + H_2O_2$) and Aqua Regia ($HCl + HNO_3$) are used to remove heavy metal such as Fe, Cu, Au and the metal such as Al which is difficult to be ionized, wherein spontaneous oxidation layer is made. To remove such oxidation layer, $DHF(HF + H_2O)$ is used. However, DHF causes extract of Cu on the wafer surface and to solve this problem, the mixed solution of $DHF + H_2O_2$ was developed.

However, $H_2O_2$ easily decompose into $H_2O + O_2$, further HF is easily volatized to make it difficult to maintain the homogeneity of the solution.

Furthermore, the produced fluorosilicon ($SiF_4$) as above formula (4) reacts with $H_2O$ to produce colloidal silicon oxide ($SiO_2$) which easily readheres to the wafer surface. When the colloidal silicon oxide resides on the surface, hazy effect occurs.

Furthermore, the etching rate is an important process parameter but the surface smoothness is also importantly required for the high integrated circuit.

Also, as reaction is proceeding, colloidal silicon oxide and Hydrogen Fluorosilicate accumulate to be disposed, which causes the generation of large amount of waste water. Consequently it is one of the subjects to solve the matter of life time of solution and waste disposal.

Among the various layers to be deposited on LCD and semiconductor wafer, for example, in case of SiNx (ex. $Si_3N_4$), higher concentration of HF is required for etching because such etching process is more difficult in comparing with $SiO_2$, wherein it is impossible to use mask for resist. 85% $H_3PO_4$ by boiling method and BOE by wet etch method can be used for etching SiNx but it may cause damage on substrate.

Alternatively plasma etch can be used, however, as throughput is low in plasma etch, it is not feasible for mass production.

For etching Al or Al alloy (ex. Al—Nb, Al—Ta), mixed acid as $H_3PO_4(65~72\%) + CH_3COOH(5~15\%) + HNO_3(5~8\%) + DI$ water (5~25%) is usually used. It is also difficult to attain uniform etching due to the matter that the bubble to be generated from reaction between Al and mixed acid adheres to the surface and difficult to separate from the surface.

OBJECT OF THE INVENTION

A need therefore exists for providing an improved cleaning and etching composition which could furnish high smoothness and high gloss together with minimizing the damage of substrate when on cleaning and etching $SiO_2$, SiNx, Al and Al alloy in the manufacturing process of electronic displays, quartz devices, and semiconductor wafer.

Another object of the invention is to provide an improved etching composition to furnish high smoothness together with minimizing the damage of substrate when etching Si substrate in the manufacturing process of single crystal silicon and wafer.

Further object of the invention is to provide an improved etching composition to furnish the better smoothness when on etching the surface of crystal glass, the raw material of which is such as $SiO_2$, $Pb_2O_3$, $In_2O_3$, and etc.

SUMMARY OF INVENTION

The invention in the first aspect discloses a composition for cleaning and etching $SiO_2$, SiNx, Al and Al alloy to be deposited on substrate in the manufacturing process of electronic displays, quartz devices, and semiconductor wafer.

The composition may comprises;
a) 0.1~50 wt % of fluoride(s), based on the total composition weight, and
b) 0.8~40 wt % of at least one selected from the group consisting of sulfonic acid, sulfonate(s) and persulfate(s), based on the total composition weight, and
c) optionally 0.01~10 wt % of inhibitor and/or 0.5~20 wt % of reaction accelerator,
wherein sulfonic acid or sulfonate(s) is selected as component b), 0.2~40 wt % of alcohol and/or 0.2~40 wt % of persulfateare are added, and wherein persulfate(s) is selected as component b), 0.01~10 wt % of surfactant is added.

The invention in the second aspect discloses the composition for etching Si substrate in manufacturing process of single crystal silicon and wafer.

The composition may comprises;
a) nitrate(s), and
b) fluoride(s),
c) optionally at least one selected from the group consisting of reaction accelerators, and surfactants,
wherein the weight ratio of nitrate(s) to fluoride(s) is in the range of 1:9~9:1 and the concentration of reaction accelerators is the range of 30~90%.

The invention in the third aspect discloses the composition for etching the surface of crystal glass, raw material of which is $SiO_2$, $Pb_2O_3$, $In_2O_3$.

The composition may comprises;
a) fluoride(s), and
b) oxalic acid and/or oxalate(s)
c) optionally, at least one selected from the group consisting of sulfuric acid, phosphoric acid, and/or mixed acid of sulfuric acid and phosphoric acid, wherein the weight ratio of fluoride(s) to oxalate(s) is in the range of 1:9~9:1, and the concentration of sulfuric acid, phosphoric acid, and/or mixed acid of sulfuric and phosphoric acid is the range of 30~90%.

DETAILS DESCRIPTION OF THE PREFERRED EMBODIMENT

Nitrate(s) and fluoride(s) according to this invention are introduced for etching Si and $SiO_2$. Nitrate(s) and fluoride(s) are used for etching Si substrate in the manufacturing process of single crystal silicon and wafer. Fluoride(s) is used for etching $SiO_2$, SINx, Al and Al alloy in the manufacturing process of electronic displays, quartz devices, and semiconductor wafer.

The reaction formulas are as follows;

$$Si + 4YNO_3 = SiO_2 + 4NO_2 + 2Y_2O_2 \quad (1)$$

$$6XF + SiO_2 = X_2SiF_6 + 2X_2O \quad (2)$$

The etching process is performed by reacting between fluoride(s) and $SiO_2$ to form fluorosilicate. Fluoride(s) itself has ordinally lower etching ability than HF, however, the lower etching ability does not matter in the present intention to attain high smoothness after removing the $SiO_2$ film.

Furthermore, fluoride(s) is etching Al and Al alloy deposited on electronic display and semiconductor wafer. The reaction formula is as follows.

$$Al + 3XF \rightarrow AlF_3 + 3X^-$$

Also, as for waste water treatment, it is well known that it is more convenient to precipitate F ion in salt (ex. $NH_4HF_2$) than F ion in acid (ex. HF). F ion content of the composition by this invention is generally less than F ion content of currently using HF and accordingly the cost for waste water treatment is less.

Example of fluoride(s) is at least one selected from the group consisting of ammonium bifluoride ($NH_4HF_2$), ammonium fluoride ($NH_4F$), sodium bifluoride ($NaHF_2$), sodium fluoride (NaF), potassium bifluoride ($KHF_2$), potassium fluoride (KF), barium fluoride ($BaF_2$) and ammonium fluoborate ($NH_4BF_4$).

Sulfonic acid and sulfonate(s) have decomposing ability of organics by $SO_2/SO_3$ and support fluoride(s) in etching process.

Example of sulfonic acid and/or sulfonate(s) is at least one selected from the group consisting of sulfamic acid ($NH_2SO_3H$), sulfosalicylic acid dehydrate ($HO_3SC_6H_3(OH)COOH \cdot 2H_2O$), ammonium sulfamate ($NH_4SO_3NH_2$), sulfonyl amide (($NH_2)_2C_6H_4SO_2$) and sodium sulfosalicylate ($NaO_3SC_6H_3(OH)COOH \cdot 2H_2O$).

Also, persulfate(s) are added for improving the oxidizing reaction by providing $H_2O_2$ to the aqueous reactions. The persulfate gradually decompose in liquid and the decomposition is more easily performed at high temperature. The generated $H_2O_2$ prevents hydrosilicofluoric acid and colloidal $SiO_2$ to adhere to the surface.

Example of persulfate(s) is at least one selected from the group consisting of sodium persulfate ($Na_2S_2O_8$), ammonium persulfate (($NH_4)_2S_2O_8$) and potassium persulfate ($K_2S_2O_8$).

The composition according to the first aspect of this invention, composed of fluoride(s) and sulfonic acid and/or sulfonate(s) and adding persulfate(s), alcohol, reaction accelerators, and/or inhibitors as optional component, is used for cleaning and precisely etching $SiO_2$, SiNx, Al and Al alloy in the manufacturing process of electronic displays, quartz devices, semiconductor wafer.

The composition according to the first aspect of this invention, composed of fluoride(s) and persulfate(s), and adding surfactant, reaction accelerator, and/or inhibitor as optional component, is used for cleaning and precisely etching $SiO_2$, SiNx, Al and Al alloy in the manufacturing process of electronic displays, quartz devices, semiconductor wafer.

Alcohol, having decomposing and dissolving ability of organics, is selected from the group of chemical formula $C_nH_{2n+1}OH(C \leq 6)$, isopropyl alcohol is more preferred.

Surfactant, improving the penetrating ability of the composition by reducing the surface tension of the component, is the one selected from the group of the surfactant to contain Na ion and/or $SO_2$ ion.

The inhibitor is used for the case that the layer to be formed on metal should be selectively removed but the metal should not be damaged.

Example of inhibitors includes amine and amide(s).

For the reaction accelerators, sulfuric acid, phosphoric acid, and/or acetic acid are selectively used.

As for the amount of each component to make the composition of this invention, on the basis of total composition weight, fluoride(s) is in the range of 0.1~50 wt %, preferably 0.4~12 wt %, mixture at least one selected from the group consisting of sulfonic acid, sulfonate(s), and/or persulfate(s) is in the range of 0.8~40 wt %, preferably 6~18 wt %, persulfate(s), when persulfate(s) is added in case that sulfonic acid, and/or sulfonate(s) are used, is in the range of 0.2~40 wt %, preferably 2~15 wt %, surfactant is in the range of 0.01~10 wt %, preferably 0.1~3 wt %, alcohol is in the range of 0.2~40 wt %, preferably 3~10 wt %, inhibitor. is in the range of 0.01~10 wt %, preferably 0.1~3 wt %, reaction accelerator is in the range of 0.05~20 wt %, preferably 1~10 wt %, and the remainder comprises of D.I water.

As the amount of fluoride(s) is closely related to the etching rate of $SiO_2$, the etching rate is in proportion to F ion amount of fluoride(s). Mixing ratio of fluoride(s) is at low concentration when the composition is for cleaning and at high concentration when the composition is for etching.

Decomposing ability of the organics is generally increased at higher concentration of sulfonic acid and/or sulfonate(s). The concentration can be controlled according to the kinds and amount of organics, preferably in the range of 0.8~40 wt %.

Persulfate(s) is helpful for improving oxidizing reaction, the amount of persulfate is 0.2~40 wt %. Hydrogen peroxide, even though it is some difficult to maintain homogeneity, can be substitutively used.

Alcohol, as aforesaid, can dissolve organics and water-soluble. The amount of alcohol can be controlled according to kinds and amount of organics, preferably in the range of 0.2~40 wt %.

Inhibitors and reaction accelerators are used by controlling the addition amount. The addition amount is controlled in consideration of characteristics and required condition of process, economic feasibility, the required cleaning and etching rate etc.

Also, surfactants can be used together in order to reduce the surface tension of the composition.

Furthermore, the composition consisting of fluoride(s), sulfonic acid and/or sulfonate(s), persulfonate(s) can be made available in powder type. The powder type can provide conveniences in transportation, handling and storage. When using, the solution is prepared by mixing the powder with D.I water and further adding alcohol, inhibitors, reaction accelerators, surfactants.

The composition according to the second aspect of the invention comprises essential components consisting of fluoride(s) and nitrate(s) and optionally surfactants. The composition is used for etching Si substrate in the manufacturing process of single crystal silicon and wafer. Nitrate(s) oxidize silicon into silicon oxide as shown in above formula(1')

Example of nitrate(s) is at least one selected from the group consisting of sodium nitrate ($NaNO_3$), ammonium nitrate ($NH_4NO_3$), potassium nitrate ($KNO_3$) and barium nitrate ($BaNO_3$).

Example of fluoride(s) is at least one selected from the group consisting of ammonium bifluoride ($NH_4HF_2$), ammonium fluoride ($NH_4F$), sodium bifluoride ($NaHF_2$), sodium fluoride ($NaF$), potassium bifluoride ($KHF_2$), potassium fluoride ($KF$), barium fluoride ($BaF_2$) and ammonium fluoborate ($NH_4BF_4$).

Example of surfactant is preferably of fluorocarbon-base which has the high surface activity and high solubility.

The composition of this invention, as exothermic reaction does not occur while etching single crystal silicon wafer, attains the more uniformed roughness without surface damage and provides advantage by shortening the polishing process.

The weight ratio of nitrate(s) to fluoride(s) is in the range of 1:9~9:1, and preferably 3:7~7:3.

Reaction accelerator is the one selected from the group consisting of sulfuric acid, phosphoric acid, or mixed acid with sulfuric acid and phosphoric acid. The concentration is in the range of 30~90 wt %, preferably 40~70 wt %.

For preparing the etching solution from the composition by the invention, nitrate(s) and fluoride(s) is mixed with D.I water to a degree of saturation and sulfuric acid/phosphoric acid is added into the solution. The mixture amount of nitrate(s) and fluoride(s) is from 10 g/l to a degree of saturation in the solution of sulfuric/phosphoric acid, preferably from 30 g/l to 200 g/l.

The mixture composition according to the second aspect of this invention can be made available in powder type. It provides the conveniences in transportation, handling and storage. When using, the solution is prepare by mixing the mixture powder with sulfuric/phosphoric acid and D.I water.

The composition according to the third aspect of the invention comprises essential components consisting of fluoride(s), oxalic acid and/or oxalate(s) and sulfuric/phosphoric acid as optional component. The composition of this invention is used for etching crystal glass. $Pb_2O_3$ as a component of crystal glass is converted to $Pb_3O_4$, PbO at high temperature during manufacturing process. Oxalic acid and/or oxalate react with the $Pb_3O_4$, PbO.

Example of oxalates is at least one selected from the group consisting of sodium oxalate ($Na_2(COO)_2$), ammonium oxalate monohydrate ($(KH_4)_2(COO)_2 \cdot H_2O$), potassium oxalate monohydrate ($K_2(COO)_2 \cdot H_2O$) and potassium trihydrogen dioxalate dihydrate ($KH_3(C_2O_4)_2 \cdot 2H_2O$).

Example of fluoride(s) is at least one selected from the group consisting of ammonium bifluoride ($NH_4HF_2$), ammonium-flouride, ($NH_4F_2$), sodium bifluoride ($NaHF_2$), sodium fluoride ($NaF$), potassium bifluoride ($KHF_2$), potassium fluoride ($KF$), barium fluoride ($BaF_2$) and ammonium fluoborate ($NH_4BF_4$).

The weight ratio of fluoride(s) to oxalate(s) is in the range of 1:9~9:1, preferably 3:7~7:3.

The mixture composition of fluoride(s) and oxalate(s) is mixed with sulfuric acid, phosphoric acid, or mixed acid of sulfuric/phosphoric acid, the concentration is in the range of 30~90%, preferably 40~70%.

The mixture combination of fluoride(s) and oxalate(s) can be controlled according to the lead oxide content of crystal glass.

Furthermore, the composition of the invention can provide the abbreviating the process such as air-bubble, vibrating, agitating, ultrasonic, or object rotating, etc.

By using the composition of the invention and with selectively combining of equipment kind, temperature, pressure, and mixing combination of the composition, and using concentration of composition, velocity, vibrating, agitating, immersion or spray, bubbling, etc, the process can be shortened and attained the improvement of treatment method at one time.

The change and modification of process and shortening of process attened by using the component of the invention shall be included within the scope of this invention.

Also the composition of the invention provides the advantage of extended life time of solution, and conveniences in waste water treatment.

EXAMPLES

Example 1

Figure 1:
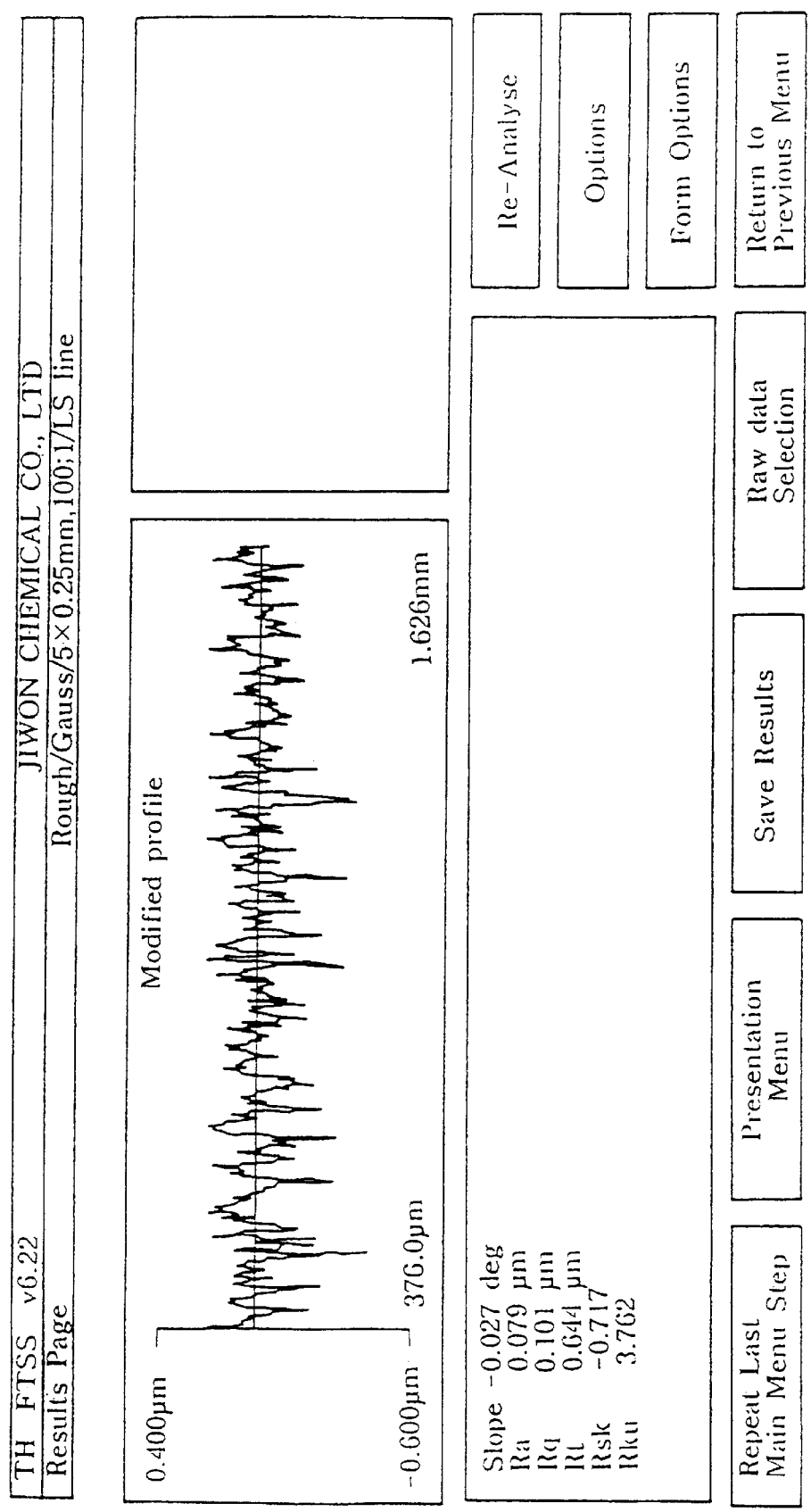
FIG. 1 is the roughness graph of the surface of semiconductor wafer etched by MAE (Mixed Acid Etchant) to be currently used in the manufacturing process of semiconductor wafer.

A composition for chemical cleaning and etching were made as below-shown table.

| Component/Composition | Ammonium bifluoride | Sulfonic acid and/or Sulfonate(s) | Persulfate | Sulfuric Acid | Nitric Acid | Oxalic Acid | Surfactant |
|---|---|---|---|---|---|---|---|
| A | 120 | 80 | 40 | — | — | — | — |
| B | 40 | 120 | 60 | — | — | — | — |
| C | 120 | 80 | 40 | 90 | — | — | — |
| D | 25 | — | — | 900 | 50 | — | — |
| E | 100 | — | — | 900 | — | 50 | — |
| F | 40 | — | 120 | — | — | — | — |
| G | 40 | — | 120 | — | — | — | 5 |
| H | 40 | 120 | — | — | — | — | — |
| I | 40 | 120 | — | — | — | — | 5 |

(unit : gr/l)
* The remainder comprises of D.I water.
* A~C and F~I : $SiO_2$, SiNx, Al and Al alloy, D : Si, E : crystal glass

Example 2-1

A comparison of cleaning ability

In order to compare the cleaning ability, test was experimented with the each composition of Example 1.
Test piece: 50 mm×50 mm×10 mm in size of CRT glass piece
Kinds of Test Piece
a. fresh panel before inner black coating
b. inner black-coated panel
c. inner coating dag funnel
d. inner screen-coated panel
e. panel before outer silica coating
f. panel after outer silica coating
g. baked panel after outer silica coating Test pieces were dipped for a certain time into beaker filled with 500 ml of the composition solution of Example 1, and the composition solution was agitated. The cleaning ability were determinated treatment times required of having a complete water-wettability to the treated surface.

| Test piece | Composition solution | Treatment time(sec.) | Water wettability | Remarks |
|---|---|---|---|---|
| a | A | 8 | O.K | |
| a | B | 7 | O.K | I.P.A 5 vol % added |
| a | 10% HF | 10 | O.K | |
| b | A | 10 | O.K | I.P.A 5 vol % added |
| b | A | 6 | O.K | |
| b | B | 6 | O.K | I.P.A 5 vol % added |
| b | B | 5 | O.K | I.P.A 15 vol % added |
| b | 10% HF | 12 | O.K | |
| c | C | 50 | O.K | |
| c | 20% HF | 50 | O.K | |
| d | A | 12 | O.K | |
| d | A | 9 | O.K | I.P.A 5 vol % added |
| d | B | 8 | O.K | I.P.A 5 vol % added |
| d | B | 7 | O.K | I.P.A 15 vol % added |
| d | 10% HF | 12 | O.K | |
| e | B | 10 | O.K | B solution:$H_2O$ = 1:4 |
| e | 2% HF | 15 | O.K | |
| f | B | 10 | O.K | B solution:$H_2O$ = 1:2 |
| f | 30% $NH_4HF_2$ | 15 | O.K | |
| g | B | 10 | O.K | |

* Temperature of solution : 25° C.
* I.P.A : Isopropyl alcohol

As shown in above table, the cleaning speed of the composition of this invention is faster than HF and $NH_4HF_2$ which are now used in CRT manufacturing process. The fluoride content of composition B is lower as ⅓ than composition A but it was found that composition B has the better result if used together with ispropyl alcohol.

Example 2-2

Comparison of cleaning ability

In order to compare the cleaning ability, test was experimented. The size of all the panel was 14 inch.
Kinds of Panel
a. panel before inner black coating
b. inner black-coated panel (defect, to be reclaimed)
c. inner screen-coated panel (defect, to be reclaimed)
d. panel after outer silica coating (defect, to be reclaimed)

The composition solution was sprayed to the panel (water head pressure: 5 m, nozzle diameter: 20 cm, distance between panel and nozzle head: 20 cm). The cleaning ability was determinated treatment times required of having a complete water-wettability.

The result is shown in below table.

| Test piece | Composition | Treatment time (sec.) | Treatment temperature(° C.) | Water wettability |
|---|---|---|---|---|
| a | F | 4 | 25 | OK |
| a | 10% HF | 6 | 25 | OK |
| b | F | 6 | 25 | OK |
| b | 10% HF | 9 | 25 | OK |
| c | F | 8 | 25 | OK |
| c | 20% HF | 12 | 25 | OK |

As shown in above table, the cleaning speed of the composition of the invention is faster than HF.

Example 3

Comparison of surface roughness

Surface roughness was measured, with test piece a. of Example 2.

| Test piece | Composition solution | Treatment time (sec.) | Treatment temperature(° C.) | Surface roughness |
|---|---|---|---|---|
| a | A | 60 | 25 | Ra: 0.064 μm<br>Rt: 0.501 μm |
| a | 10% HF | 60 | 25 | Ra: 0.069 μm<br>Rt: 0.724 μm |

As shown in above table, the Ra, and Rt value of composition A of this invention is lower than those of 10% HF, thus surface roughness is more uniform and coating result.

Also, from the fact of lower Rt value it is expected that surface pit phenomena will be improved.

Example 4-1

Comparison of gloss value and water wettability

With test piece g. of Example 2, one test piece was treated by $CeO_2$ polishing (polishing pressure 4 kg/cm²), the method of which is now used in CRT manufacturing, and the other test piece was treated by composition B of this invention and manually polished by hand (Polishing pressure 0.5 kg/cm² or less).

The results are as shown in below table.

| | Gloss value | Water-wettability |
|---|---|---|
| Fresh panel | 97.25% | not good |
| $CeO_2$ polishing | 96.4% | not good |
| Composition B | 97.25% | O.K |

As shown in above table, gloss value is completely recovered when treated with composition B. From the fact of water-wettability it is also known that composition B of this invention completely cleans the surface.

Further, it was found that there does not occur a surface scratch phenomena when treated with composition B of this invention while the current method of $CeO_2$ polishing remains surface scratch to cause sparkling defect.

Example 4-2

Comparison of gloss value and water wettability

With test piece d. of Example 2, one test piece was treated by $CeO_2$ polishing (polishing pressure 4 kg/cm$^2$), and the other test piece was treated by composition G of Example 1 and manually polished by hand (Polishing pressure 0.5 kg/cm$^2$ or less).

The results are as shown as below table.

|  | Gloss value | Water-wettability |
| --- | --- | --- |
| Fresh panel | 97.25% | OK |
| CeO$_2$ polishing | 96.4% | OK |
| Composition G | 97.25% | OK |

As shown in above table, gloss value is recovered when treated by composition G. Also, from the fact of water-wettability it is known that composition G can clean the organics completely to prevent defect on the coating. The scratch to be made from $CeO_2$ polishing causes sparkling defect. The composition G does not make scratch.

Example 5

Comparison of weight loss

Test was experimented by dipping the test piece into 12% HF solution and the composition solution of this invention. Each solution in 200 ml beaker maintains at temperature 25° C. and the solution was air-bubbled. Glass piece of 50 mm×50 mm×10 mm in size was dipped for 10 minutes. Weight loss was measured as shown in below table.

|  | 12% HF | Composition A | 50% diluted composition A | Composition B |
| --- | --- | --- | --- | --- |
| Weight before dip (g) | 36.78 | 37.52 | 37.05 | 35.78 |
| Weight after dip | 35.78 | 37.05 | 36.78 | 35.64 |
| Weight loss(%) | 2.72 | 1.25 | 0.73 | 0.39 |
| F ion amount(ppm) | 55,000 | 80,000 | 40,000 | 26,000 |

As shown in above table, it is known that glass etching ratio is proportionally related to the F ion amount.

F ion of HF solution is of reactivated status and actively corrodes the glass ($SiO_2$). By reacting HF with $SiO_2$, $H_2SiF_6$ is produced and amount of $H_2SiF_6$ gradually increases, and life time of solution becomes shortened. In comparing a loss weight between of HF with the composition of this invention, it is known that life time of the composition solution will be longer than HF.

Example 6-1

Comparison of water-wettability and treatment time for LCD

With test piece of LCD bare glass 50 mm×50 mm×0.7 mm in size, test was experimented by preparing the currently using DHF solution (HF:$H_2O$=1: 100) and diluted composition solution (composition B solution:$H_2O$=2:8). The test piece was dipped in the solution at temperature of 25° C.

The results are shown in the below table.

|  | Compound solution B1 | B1 + I.P.A 5 vol % | B1 + I.P.A 25 vol % | DHF | DHF |
| --- | --- | --- | --- | --- | --- |
| F ion amount (ppm) | 532 | 505 | 399 | 475 | 475 |
| Dipping time (sec.) | 10 | 5 | 3 | 30 | 40 |
| Water-wettability | O.K | O.K | O.K | Not good | O.K |

* I.P.A : Isopropyl alcohol

As shown in above table, the composition of this invention can completely clean the surface for 3~10 seconds, especially, in case of composition solution made of B1+I.P.A 25vol % the result was much better. In case of DHF, it needs more than 30 seconds for having water-wettability.

Example 6-2

Comparison of water-wettability and treatment time for LCD

With test piece of LCD bare glass 50 mm×50 mm×0.7 mm in size, test was experimented by preparing DHF (HF:$H_2O$=1: 100) which is now used for cleaning LCD in manufacturing process and preparing the diluted G1 solution (composition G:$H_2O$=2:8). The test piece was dipped in the agitated solution at temperature of 25° C.

The results are shown in the below table.

|  | Composition G | DHF | DHF |
| --- | --- | --- | --- |
| F ion amount (ppm) | 532 | 475 | 475 |
| Dipping time (sec.) | 3 | 30 | 40 |
| Water-wettability | O.K | Not good | Not good |

As shown in above table, the cleaning speed is much faster than the composition of the invention.

Example 6-3

Treatment test of SiNx layer and Al—Nb to be deposited on LCD

Two test pieces of LCD 50 mm×50 mm×0.7 mm in size was prepared one is SiNx layer 3000 Å, and the other is Al—Nb layer 2500 Å. SiNx was dipped in BOE (40% $NH_4F$:50% HF=20:1) which is conventionally using etchant and in the composition F,G,H and I of the invention. Al—Nb was dipped in Al etchant ($H_3PO_4$:$CH_3COOH$:$HNO_3$= 65:5:5:25) and in the composition F,G,H and I of the invention.

The results are shown in the below table.

|  | Composition | Treatment temperature (25° C.) | Treatment time (sec.) |
| --- | --- | --- | --- |
| SiNx | F | 25 | 120 |
|  | G | 25 | 90 |
|  | H | 25 | 120 |

-continued

|  | Composition | Treatment temperature (25° C.) | Treatment time (sec.) |
|---|---|---|---|
|  | I | 25 | 90 |
|  | BOE | 25 | 180 |
| Al-Nb | F | 25 | 360 |
|  | G | 25 | 360 |
|  | H | 25 | 90 |
|  | I | 25 | 60 |
|  | Al etchant | 25 | 300 |

As shown in above table, LCD was treated in shorter time by the composition of this invention without damage of substrate.

Example 7

Comparison of weight loss and water-wettability for quartz devices

With test piece of quartz devices 50 mm×50 mm×3 mm in size, test was experimented by preparing HF solution and the composition A of this invention. The test piece was dipped in the solution at temperature of 25° C. for 10 minutes and visual inspection of surface particles was visually inspected.

The result are shown in the below table.

|  | Treatment time (min.) | Weight loss (%) | Water-wettability | Visual Inspection of particles |
|---|---|---|---|---|
| 15% HP | 10 | 0.12 | O.K | O.K |
| Composition solution A | 10 | 0.06 | O.K | O.K |

As shown in above table, the weight loss of composition A of this invention is much less than that of 15% HF while 15% HF corrodes the quartz much more.

It was found that the composition of this invention can clean more effectively the surface contaminants with much less corrosion.

It can be assumed that quartz devices can be used for more longer time when using the composition of the invention.

Example 8

Comparison of surface roughness of wafer

For the test, test piece of wafer was prepared.
a. Wafer after lapping and chemical polishing
b. Wafer after slicing
c. Wafer before SiO₂ coating
d. Wafer after SiO₂ coating 1000 Å

With test piece a., 50 mm×50 mm×750 μm in size, test was experimented by preparing the currently using solution MAE ($HNO_3$:HF:$CH_3COOH$=2.5:1:1) and the composition D solution of this invention. The test piece was dipped in the air-bubbled solution at temperature of 25° C. for 20 minutes. The surface roughness was measured, and the result are shown in the below table.

|  | Roughness (μm) | 1st check | 2nd check | 3rd check | 4th check | 5th check | Average |
|---|---|---|---|---|---|---|---|
| Composition solution D | Ra | 0.024 | 0.022 | 0.019 | 0.016 | 0.016 | 0.0194 |
|  | Rq | 0.031 | 0.03 | 0.024 | 0.021 | 0.021 | 0.0254 |
|  | Rt | 0.234 | 0.312 | 0.143 | 0.202 | 0.141 | 0.2064 |
| MAE | Ra | 0.079 | 0.08 | 0.103 | 0.08 | 0.08 | 0.0844 |
|  | Rq | 0.101 | 0.103 | 0.145 | 0.104 | 0.105 | 0.1116 |
|  | Rt | 0.644 | 0.793 | 1.223 | 1.027 | 0.739 | 0.8852 |

Figure 2:
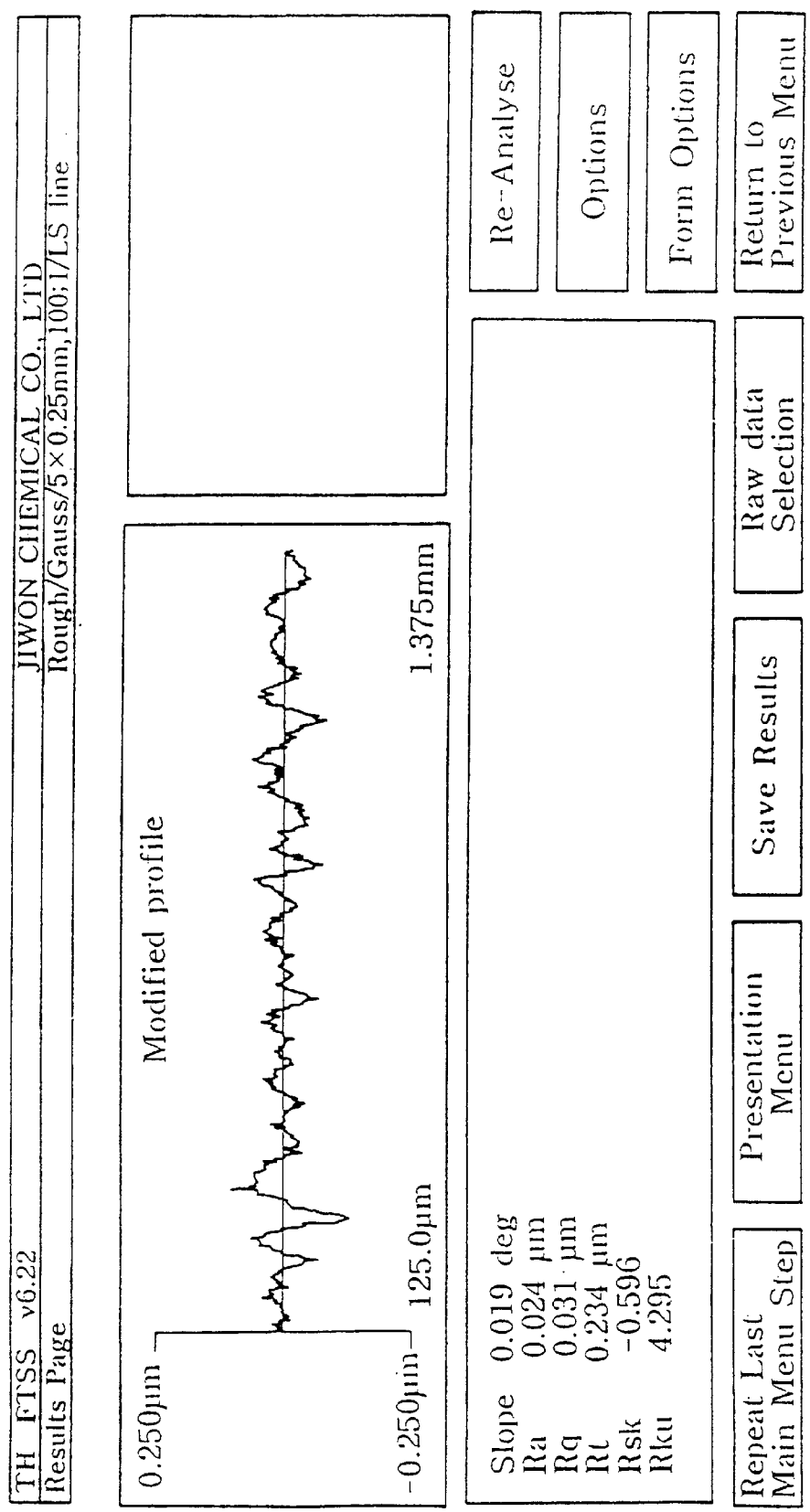
FIG. 2 is the roughness graph of the surface of semiconductor wafer etched by the composition of this invention.

As shown in above table, the values of Ra, Rg and Rt by the composition D of this invention are much better than those of MAE. The roughness graph was plotted by using Surface Roughness Meter (Talysurf-II Series, Rank Taylor Hobson, UK) and Gauss Filter. These graphs are shown in FIG. 1 and FIG. 2.

After etching the wafer, the etching thickness was measured and the result is shown in below table.

| Test piece | Etching solution | Treatment time (min.) | Treatment temperature | Surface roughness (μm) | Etching thickness (μm) |
|---|---|---|---|---|---|
| a | composition D | 20 | 25–27° C. | Ra: 0.019 Rt: 0.206 | 25 |
| a | MAE | 1.5 | 25–45° C. | Ra: 0.084 Rt: 0.885 | 32 |

As shown in above table, the composition D of this invention results in less etching thickness of 7 μm or less than etching thickness of MAE and better surface roughness. The temperature increase of chemical reaction is only 2° C. in case of composition D while showed differences by 20° C. from MAE. It was found that solution stability of composition D was much better than MAE.

In order to shorten the etching rate, composition D1 of modified components as ammonium bifluoride 150 g/l, nitrate(s) 300 g/l, sulfuric acid 900 g/l was prepared and test was made. The treating time was shortened by 2 minutes, solution temperature increased from 25° C. to 40° C., Ra was 0.06 μm, Rt 0.82 μm, and etching thickness was 27 μm.

It is generally understood that it is difficult to get the uniformed surface at high speed and in order to slow down the speed acetic acid as buffering agent is used for preparing MAE.

It is expected that etching speed can be controlled by changing the components ratio of the composition and achieved the desired uniformed surface.

Example 9

Test of hydrophobicity and particles (wafer)

With wafer test piece b,c and d of Example 8, 50 mm×50 mm×650 μm in size, respectively, test was experimented. Test pieces were dipped in the composition solution of this invention.

The results are shown in the below table.

| Test piece | Composition | Treatment time (min.) | Treatment temperature(° C.) | Hydrophobicity | Particle inspection |
|---|---|---|---|---|---|
| b | A | 5 | 25 | O | OK |
| c | A | 8 | 25 | O | OK |
| d | A | 2 | 25 | O | OK |
| d | B | 6 | 25 | O | OK |

From a test result of hydrophobicity as shown in above table, it is assumed that oxide layer is completely removed.

In case of test piece b, it was seen that the composition of this invention cleans the wafer within 5 minutes without pre-treatment by TCE and $H_2O_2$ which are currently used for removing the organics in wafer manufacturing.

In case of test piece c, it was seen that the composition of this invention cleans the wafer within 8 minutes, without pre-treating with mixed acid($HNO_3$+HCL=1:3).

In case of test piece d, etching result was 166~500 Å/min in 2 minutes after treatment, thus it is assumed that the composition of this invention has a suitable etching ability to be acceptable.

The etching rate can be controlled by changing the content ratio of fluoride(s).

Example 10

Etching test for crystal glass

With crystal glass, test was experimented by dipping into E solution of Example 1 at 55° C. for one hour.

In 3 minutes after dipping, crystal glass was taken out from the solution and $H_2SiF_6$ formed on the surface was cleaned, and re-dipped for 57 minutes.

It was found that the composition of this invention can perform sufficiently etching on crystal glass.

What is claimed is:

1. A composition for chemical cleaning and/or etching $SiO_2$ in the manufacturing process of electronic displays, quartz devices, and/or semiconductor wafers, which comprises:
    a) 0.1–50 wt % of fluoride(s), based on the total composition weight, said fluoride being reacted with the $SiO_2$ to form fluorosilicate and having a lower etching ability than HF;
    b) 0.8–40 wt % of persulfate(s), based on the total composition weight, wherein said persulfate(s) gradually decomposes in an aqueous solution to provide $H_2O_2$ which prevents the fluorosilicate and the $SiO_2$ in a colloidal state from adhering to a surface of the electronic displays quartz devices and/or semiconductor wafers;and
    c) at least one of isopropyl alcohol and/or at least one inhibitor,
wherein the at least one inhibitor is selected from amine(s) and amide(s).

2. The composition of claim 1, wherein the composition comprises:
    a) 0.4–12 wt % of fluoride(s), based on the total composition weight, said fluoride being reacted with the $SiO_2$ to form fluorosilicate and having a lower etching ability than HF;
    b) 6–8 wt % of persulfate(s), based on the total composition weight, wherein said persulfate(s) gradually decomposes in an aqueous solution to provide $H_2O_2$ which prevents the fluorosilicate and the $SiO_2$ in a colloidal state from adhering to a surface of the electronic displays quartz devices and/or semiconductor wafers; and
    c) at least one of isopropyl alcohol and/or at least one inhibitor
wherein the at least one inhibitor is selected from amine(s) and amide(s).

3. The composition of claim 1, wherein the fluoride is at least one selected from the group consisting of ammonium bifluoride ($NH_4HF_2$), ammonium fluoride ($NH_4F$), sodium bifluoride ($NaHF_2$), potassium fluoride (KF), barium fluoride ($BaF_2$), and ammonium fluoborate ($NH_4BF_4$).

4. The composition of claim 1, wherein said composition further comprises at least one sulfonic acid or sulfonate which is selected from the group consisting of sulfamic acid ($NH_2SO_3H$), sulfosalicylic acid dihydrate ($HO_3SC_6H_3(OH)COOH\cdot 2H_2O$), ammonium sulfamate ($NH_4S_3NH_2$), sulfonyl amid (($NH_2)_2C_6H_4SO_2$), and sodium sulfosalicylate ($NaO_3SC_6H_3(OH)COOH\cdot H_2O$).

5. The composition of claim 1, wherein the persulfate is at least one selected from the group consisting of sodium persulfate ($Na_2S_2O_8$), ammonium persulfate (($NH_4)_2S_2O_8$), and potassium persulfate ($K_2S_2O_8$).

6. The composition of claim 1, wherein the composition further comprises at least one reaction accelerator selected from the group consisting of sulfuric acid, phosphoric acid and acetic acid.

7. A composition for cleaning and etching an Si substrate in the fabricating process of single crystal silicon and wafer, which comprises;
    a) nitrate(s) for oxidizing silicon to silicon oxide;
    b) fluorides(s) being reacted with the silicon oxide to form fluorosilicate;
    c) at least one reaction accelerator; and
    d) at least one of isopropyl alcohol and/or at least one inhibitor,
wherein the at least one inhibitor is selected from amine(s) and amide(s), and
wherein the weight ratio of nitrate(s) to fluoride(s) is in the range of 1:9–9:1 and the concentration of the at least one reaction accelerator in the range of 30–90%.

8. The composition of claim 7, wherein the weight ratio of nitrate(s) to fluoride(s) is in the range of 3:7–7:3 and the concentration of the at least one reaction accelerator is the range of 40–70%.

9. The composition of claim 7, wherein the nitrate(s) is at least one selected from the group consisting of sodium nitrate ($NaNO_3$), ammonium nitrate ($NH_4NO_3$), potassium nitrate ($KNO_3$) and barium nitrate ($BaNO_3$).

10. The composition of claim 7, wherein the fluoride(s) is at least one selected from the group consisting of ammonium bifluoride ($NH_4HF_2$), ammonium fluoride ($NH_4F$), sodium bifluoride ($NaHF_2$), sodium fluoride (NaF), potassium bifluoride ($KHF_2$), potassium fluoride (KF), barium fluoride ($BaF_2$) and ammonium fluoborate ($NH_4BF_4$).

11. The composition of claim 7, wherein the at least one reaction accelerator is selected from the group consisting of sulfuric acid, phosphoric acid, and a mixed solution of sulfuric acid and phosphoric acid.

12. The composition of claim 7, wherein the composition further comprises at least one surfactant which is a fluorocarbon type surfactant.

13. A composition for etching crystal glass, which comprises:
    a) fluoride(s) having a lower etching ability than HF when etching silicon oxide contained in the crystal glass;

b) oxalate(s); and c) at least one compound selected from the group consisting of sulfuric acid, phosphoric acid, and/or a mixture of sulfuric acid and phosphoric acid, wherein the weight ratio of fluoride(s) to oxalic acid and/or oxalate(s) is in the range of 1:9–9:1, and the concentration of sulfuric acid, phosphoric acid, and/or the mixture of sulfuric and phosphoric acid is the range of 30–90%, wherein the oxalate(s) is at least one selected from the group consisting of sodium oxalate ($Na_2(COO)_2$), ammonium oxalate monohydrate (($NH_4)_2(COO)_2 \cdot H_2O$) potassium oxalate monohydrate ($K_2(COO)_2 \cdot H_2O$), and potassium trihydrogen dioxalate dihydrate ($KH_3(C_2O_4)_2 \cdot 2H_2O$).

14. The composition of claim 13, wherein the weight ratio of fluoride(s) to oxalate(s) is in the range of 3:7–7:3, and the concentration of sulfuric acid, phosphoric acid, and/or the mixture of sulfuric and phosphoric acid is the range of 40–70%.

15. The composition of claim 13, wherein the fluoride(s) is at least one selected from the group consisting of ammonium bifluoride ($NH_4HF_2$), ammonium fluoride ($NH_4F$), sodium bifluoride ($NaHF_2$), sodium fluoride ($NaF$), potassium bifluoride ($KHF_2$), potassium fluoride ($KF$), barium fluoride ($BaF_2$) and ammonium fluoborate ($NH_4BF_4$).

16. A composition for chemical cleaning and/or etching $SiO_2$ in the manufacturing process of electronic displays, quartz devices, and/or semiconductor wafers, which comprises:

a) 0.4–12 wt % of fluoride(s), based on the total composition weight, said fluoride being reacted with $SiO_2$ to form fluorosilicate and having a lower etching ability than HF;

b) 2–15 wt % of persulfate(s), based on the total composition weight, wherein said persulfate(s) gradually decomposes in an aqueous solution to provide $H_2O_2$ which prevents the fluorosilicate and the $SiO_2$ in a colloidal state from adhering to a surface of the electronic displays, quartz devices, and/or semiconductor wafers;

c) 6–18 wt % of sulfamic acid for decomposing organic compounds and improving the etching of the fluoride (s); and d) at least one of isopropyl alcohol and/or at least one inhibitor, wherein the at least one inhibitor is selected from amine(s) and amide(s).

17. The composition of claim 16, wherein the persulfate (s) is at least one selected from the group consisting of sodium persulfate ($Na_2S_2O_8$), ammonium persulfate (($NH_4)_2S_2O_8$), potassium persulfate ($K_2S_2O_8$).

18. A composition for cleaning and etching an Si substrate in the fabricating process of single crystal silicon and wafer, which consists essentially of:

a) nitrate(s) for oxidizing silicon to silicon oxide;

b) fluorides(s) being reacted with the silicon oxide to form fluorosilicate;

c) at least one reaction accelerator selected from the group consisting of sulfuric acid, phosphoric acid, mixed solution of sulfuric acid and phosphoric acid; and d) at least one of isopropyl alcohol and/or at least one inhibitor, wherein the at least one inhibitor is selected from amine(s) and amide(s), and wherein the weight ratio of nitrate(s) to fluoride(s) is in the range of 3:7–7:3 and the concentration of reaction accelerators in the range of 40–70%.

* * * * *